United States Patent
Agapiou et al.

(10) Patent No.: US 12,416,673 B2
(45) Date of Patent: Sep. 16, 2025

(54) SYSTEMS AND METHODS FOR TESTING PARTIAL DISCHARGE DURING THE LEAKAGE AND/OR SURGE TESTS FOR ELECTRIC MACHINES

(71) Applicant: GM GLOBAL TECHNOLOGY OPERATIONS LLC, Detroit, MI (US)

(72) Inventors: John S. Agapiou, Rochester Hills, MI (US); Ronald M. Lesperance, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 294 days.

(21) Appl. No.: 17/964,214

(22) Filed: Oct. 12, 2022

(65) Prior Publication Data

US 2024/0125840 A1    Apr. 18, 2024

(51) Int. Cl.
| | |
|---|---|
| *G01R 31/34* | (2020.01) |
| *G01R 19/165* | (2006.01) |
| *G01R 31/12* | (2020.01) |
| *G01R 31/72* | (2020.01) |

(52) U.S. Cl.
CPC ....... *G01R 31/346* (2013.01); *G01R 31/1227* (2013.01); *G01R 31/1272* (2013.01); *G01R 31/72* (2020.01); *G01R 19/16576* (2013.01); *G01R 31/34* (2013.01)

(58) Field of Classification Search
CPC ........... G01R 31/1227; G01R 31/1272; G01R 31/34; G01R 31/346; G01R 31/72
See application file for complete search history.

(56) References Cited

U.S. PATENT DOCUMENTS

| | | | | |
|---|---|---|---|---|
| 4,058,804 | A * | 11/1977 | Sawada | G01R 31/34 340/679 |
| 5,680,059 | A * | 10/1997 | Shiota | G01R 31/343 324/765.01 |
| 6,054,865 | A * | 4/2000 | Bald | G01R 27/20 324/73.1 |
| 6,242,900 | B1 * | 6/2001 | Fawcett | G01R 31/12 324/520 |
| 6,323,658 | B1 * | 11/2001 | Kendig | G01R 31/343 324/551 |
| 8,312,914 | B2 | 11/2012 | Walker et al. | |
| 8,347,485 | B2 | 1/2013 | Biederman et al. | |
| 8,523,045 | B2 | 9/2013 | Perry et al. | |
| 9,046,577 | B2 | 6/2015 | Agapiou et al. | |

(Continued)

OTHER PUBLICATIONS

U.S. Appl. No. 17/448,990, filed Sep. 27, 2021, Lesperance.

(Continued)

*Primary Examiner* — Steven L Yeninas (57) ABSTRACT

A testing system includes an AC signal generator configured to selectively generate a sinusoidal signal including a plurality of cycles. A dielectric strength and partial discharge tester sequentially performs dielectric strength and partial discharge testing of a stator of an electric machine using the sinusoidal signal. Another testing system includes an impulse signal generator configured to selectively generate an impulse signal including a plurality of cycles. A surge and partial discharge tester for sequentially performing surge and partial discharge testing of a stator of an electric machine using the impulse signal.

18 Claims, 5 Drawing Sheets

(56) References Cited

U.S. PATENT DOCUMENTS

| | | | |
|---|---|---|---|
| 9,073,143 B2 | 7/2015 | Perry et al. | |
| 9,372,221 B1* | 6/2016 | Bierman | H03K 19/17764 |
| 9,397,539 B2 | 7/2016 | Kleber et al. | |
| 9,476,344 B2 | 10/2016 | Clement et al. | |
| 9,482,710 B2 | 11/2016 | Agapiou et al. | |
| 9,973,067 B2 | 5/2018 | Hanna et al. | |
| 10,036,083 B2 | 7/2018 | Schroth et al. | |
| 10,240,222 B2 | 3/2019 | Schroth et al. | |
| 10,632,571 B2 | 4/2020 | Wang et al. | |
| 10,879,752 B2 | 12/2020 | Agapiou et al. | |
| 10,958,144 B2 | 3/2021 | Agapiou et al. | |
| 10,992,212 B2 | 4/2021 | Agapiou et al. | |
| 11,063,499 B2 | 7/2021 | Agapiou | |
| 11,131,739 B2 | 9/2021 | Lesperance et al. | |
| 2005/0218906 A1* | 10/2005 | Younsi | G01R 31/346 324/551 |
| 2005/0218907 A1* | 10/2005 | Lee | H01H 31/12 324/510 |
| 2006/0038573 A1* | 2/2006 | Sarkozi | G01R 31/1272 324/536 |
| 2008/0048668 A1* | 2/2008 | Mashikian | G01R 31/083 324/541 |
| 2012/0182040 A1* | 7/2012 | Obata | G01R 31/1272 324/765.01 |
| 2013/0033214 A1* | 2/2013 | Obata | G01R 31/1227 324/765.01 |
| 2014/0062525 A1* | 3/2014 | Obata | G01R 31/346 324/765.01 |
| 2015/0073733 A1* | 3/2015 | Agapiou | G01R 31/343 702/58 |
| 2015/0247901 A1* | 9/2015 | Okada | G01R 31/34 324/765.01 |
| 2017/0030957 A1* | 2/2017 | Bierman | G01R 31/14 |
| 2020/0400736 A1* | 12/2020 | Severns | G01R 17/10 |
| 2021/0031297 A1 | 2/2021 | Wang et al. | |
| 2022/0052563 A1 | 2/2022 | Muratov et al. | |
| 2022/0131450 A1 | 4/2022 | Agapiou et al. | |
| 2022/0231587 A1 | 7/2022 | Agapiou et al. | |

OTHER PUBLICATIONS

U.S. Appl. No. 17/898,672, filed Aug. 30, 2022, Fatemi et al.
U.S. Appl. No. 17/901,144, filed Sep. 1, 2022, Fatemi.
"Improved Runner-Gating System for Die Cast Squirrel Cage Rotors"; Research Disclosure database No. 669005; Published in the Jan. 2020 paper journal; Published digitally Nov. 26, 2019; www.researchdisclosure.com; 2 pages.
"Self-Fluxing Coating of Shorting Bars for Hybrid Motor Rotors"; Research Disclosure database No. 656025; Published in the Dec. 2018 paper journal; Published digitally Nov. 5, 2018; www.researchdisclosure.com; 2 pages.

* cited by examiner

SYSTEMS AND METHODS FOR TESTING PARTIAL DISCHARGE DURING THE LEAKAGE AND/OR SURGE TESTS FOR ELECTRIC MACHINES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to electric machine testing, and more particularly to systems and methods for testing partial discharge during leakage and/or surge test for electric machines.

Electric vehicles (EVs) such as battery electric vehicles (BEVs), hybrid vehicles, and/or fuel cell vehicles include one or more electric machines and a battery system. The battery system provides power to the one or more electric machines and receives power from the one or more electric machines and/or a utility. The battery system includes one or more battery cells, modules and/or packs. A power control system is used to control charging and/or discharging of the battery system during charging and/or driving.

The electric machines include a rotor and stator including stator windings. During manufacturing of the electric machines, testing is performed to identify short circuits in stator insulation and/or shorts in magnet wire insulation. Testing is also performed to identify stator stack assembly concerns.

SUMMARY

A testing system includes an AC signal generator configured to selectively generate a sinusoidal signal including a plurality of cycles. A dielectric strength and partial discharge tester sequentially performs dielectric strength and partial discharge testing of a stator of an electric machine using the sinusoidal signal.

In other features, the dielectric strength and partial discharge tester includes a current sensor, a filter, and a switching system configured to connect the AC signal generator to a stator of the electric machine and to the current sensor during a dielectric strength test. A controller is configured to receive an output of the current sensor during the dielectric strength test and to evaluate dielectric strength of the electric machine based thereon.

In other features, the switching system is configured to connect the AC signal generator to the stator of the electric machine and the filter during partial discharge testing. The controller is further configured to receive an output of the filter during the partial discharge testing and to evaluate partial discharge of the electric machine.

In other features, an antenna has an output connected to the filter. The switching system is configured to connect the AC signal generator to the stator of the electric machine during partial discharge testing. The controller is further configured to receive an output of the filter during the partial discharge testing and to evaluate partial discharge of the electric machine.

In other features, during dielectric strength testing, the switching system is configured to connect the AC signal generator to the stator of the electric machine and to the current sensor during X of the plurality of cycles, where X is an integer greater than one. During partial discharge testing, the switching system is configured to connect to the filter and the stator of the electric machine during Y of the plurality of cycles, where Y is an integer greater than one. X is in a range from 10 to 50, and Y is in a range from 10 to 15. The filter comprises a high pass filter.

In other features, the controller identifies a partial discharge event when a filtered voltage output by the high pass filter has a voltage greater than a predetermined voltage threshold. A voltage of the sinusoidal signal has a magnitude in a range from 300 V to 5000V.

A testing system includes an impulse signal generator configured to selectively generate an impulse signal including a plurality of cycles. A surge and partial discharge tester for sequentially performing surge and partial discharge testing of a stator of an electric machine using the impulse signal.

In other features, the surge and partial discharge tester includes an analog to digital (A/D) converter and attenuator; a filter; and a switching system configured to connect the impulse signal generator to a stator of the electric machine and to the A/D converter and attenuator during a surge test. A controller is configured to receive an output of the A/D converter and attenuator during the surge test.

In other features, the switching system is configured to connect the impulse signal generator to the stator of the electric machine and the filter during partial discharge testing. The controller is further configured to receive an output of the filter during the partial discharge testing and to evaluate partial discharge of the electric machine.

In other features, an antenna having an output connected to the filter. The switching system is configured to connect the impulse signal generator to the stator of the electric machine during partial discharge testing. The controller is further configured to receive an output of the filter during the partial discharge testing and to evaluate partial discharge of the electric machine.

In other features, during surge testing, the switching system is configured to connect the impulse signal generator to the stator of the electric machine and to the A/D converter and attenuator. The filter comprises a high pass filter. The controller identifies a partial discharge event when a filtered voltage output by the high pass filter has a voltage greater than a predetermined voltage threshold. A voltage of the impulse signal has a magnitude in a range from 300 V to 5000V.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Testing of the stator of an electric machine typically includes a dielectric strength test (or HiPot test) and/or a surge test. These tests are performed to identify faults that may occur when a high voltage causes insulating materials of the electric machine to fail.

During the dielectric strength test, a sinusoidal voltage having a large magnitude is output to one phase winding and the other phase windings are connected to ground. Leakage current is measured between the winding that is energized and the other windings that are grounded. In some examples, ground corresponds to a lamination stack of the electric machine.

The surge test evaluates defects between phases and/or stator turns. In other words, the surge test indicates imbalance between phases. The amount of imbalance increases when there is a short circuit or another defect. During the surge test, an impulse signal such as a square wave having a high voltage and fast rise time is output between two phases to evaluate the leakage characteristics between the two phases.

A partial discharge tests can also use the sinusoidal signal and/or the impulse signal of the dielectric strength test and the surge test, respectively, to evaluate other characteristics of phase winding weakness. During the PD tests, high frequency components are isolated and analyzed. PD can provide an early indication of insulation quality.

Testing systems and methods according to the present disclosure evaluate partial discharge (PD) of a stator at the same time that the dielectric strength test and/or the surge test are performed, which reduces overall testing time. The dielectric strength and PD test evaluates defects through the full winding of the stator. The surge and PD test evaluates the performance of the windings at the front of the stator that are affected by a power inverter and checks for defects between phases (e.g., turn-to-turn or phase to ground).

Figure 1:
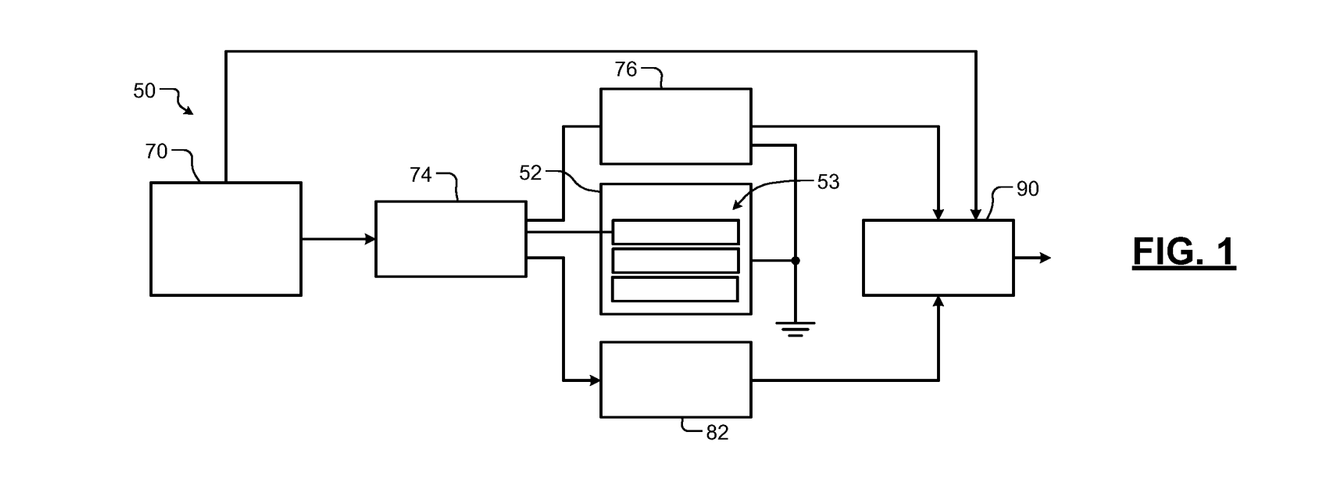
FIG. 1 is a functional block diagram of an example of a dielectric strength and partial discharge tester according to the present disclosure.

Referring now to FIG. 1, a testing system 50 for performing dielectric strength testing for a stator 52 (including windings 53) of an electric machine is shown. The testing system 50 includes an AC signal generator 70 that selectively outputs a sinusoidal signal having a predetermined magnitude, frequency, and duration (e.g., number of cycles).

The testing system 50 further includes a switching system 74 configured to selectively connect and/or disconnect a current sensor 76 and/or a filter 82 to the energized winding. The current sensor 76 senses leakage current flowing from the energized winding to ground. A controller 90 analyzes the output of the current sensor 76 during the dielectric strength portion of the test and the output of the filter 82 during the PD portion of the test.

In some examples, the sinusoidal signal output by the AC signal generator 70 has a voltage magnitude in a range from 300 V to 5000V. In some examples, the AC signal has voltage magnitude in a range from 300 V to 2500 V. In some examples, the AC signal generator 70 has a fast rise time (500V/s). The voltage magnitude and number of cycles of the AC signal generator 70 are selected based upon the specifications of the stator under test. As can be appreciated, the dielectric strength test can be run one or more times on each winding.

An output of the AC signal generator 70 is selectively connected by the switching system 74 to a winding of the stator 52 (e.g., corresponding to a selected stator phase lead) during the dielectric strength tests. When the AC signal generator 70 outputs the AC signal, at least one winding within the stator 52 is energized.

During PD testing, a high frequency signal is reflected onto the output of the AC signal generator 70 and is isolated by the filter 82. For example, the reflected signal includes high-frequency noise overlapping the output of the AC signal generator 70. The filter 82 blocks low frequency components including the input signal and outputs the high frequency portion to the controller 90. The controller 90 selectively identifies PD occurring in the stator 52 based on the high frequency portions.

Figure 2:
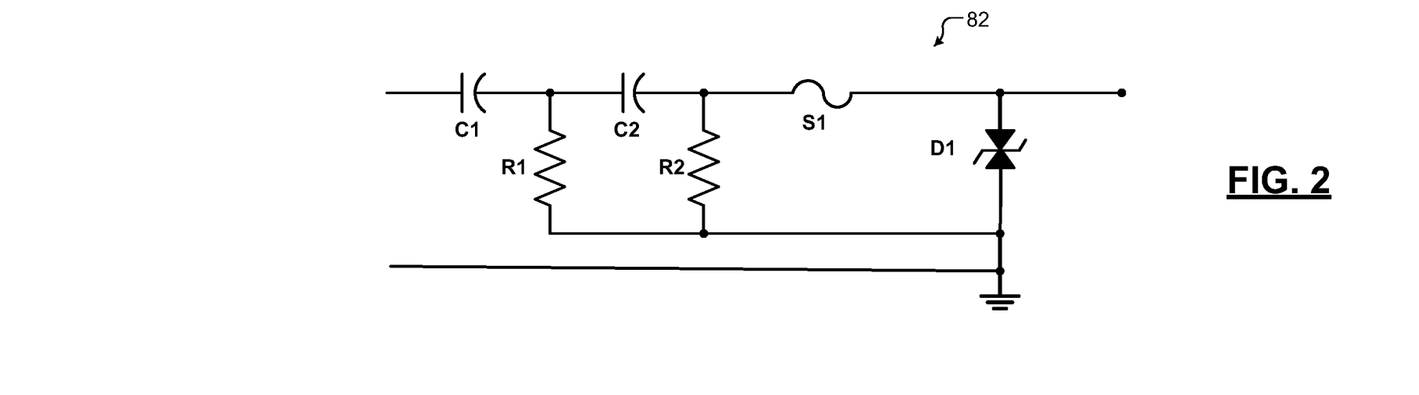
FIG. 2 is an electrical schematic of an example of a filter according to the present disclosure.

Referring now to FIG. 2, an example of the filter 82 is shown. The filter includes a first capacitor C1, a second capacitor C2, a first resistor R1, a second resistor R2, a fuse S1, and a Zener diode pair D1/D2. A first terminal of the capacitor C1 is connected to an input of the filter 82. A second terminal of the capacitor C1 is connected to first terminals of the first resistance R1 and a second capacitor C2. A second terminal of the second capacitor C2 is connected to first terminals of the second resistor R2 and the fuse S1. A second terminal of the fuse S1 is connected to an anode of a first Zener diode D1 and to an output of the filter 82. A second terminal of the first resistor R1 and a second terminal of the second resistor R2 are connected to an anode of a second Zener diode D2 and to ground. Cathodes of the first Zener diode D1 and the second Zener diode D2 are connected together.

For example, a PD signal may include high frequency components above 20 MHz and the output of the AC signal generator 70 has a frequency of 1 kHz. In some examples, the filter 82 is a high pass filter having a cutoff frequency higher than 1 kHz (e.g., 20 MHz, 50 MHz or another frequency). In some examples, the filter 82 has a variable cutoff frequency that can be electronically varied. In some examples, the controller 90 receives the output of the filter 82, determines a peak amplitude and frequency of the filtered signal, and selectively identifies PD in response thereto.

Figure 3:
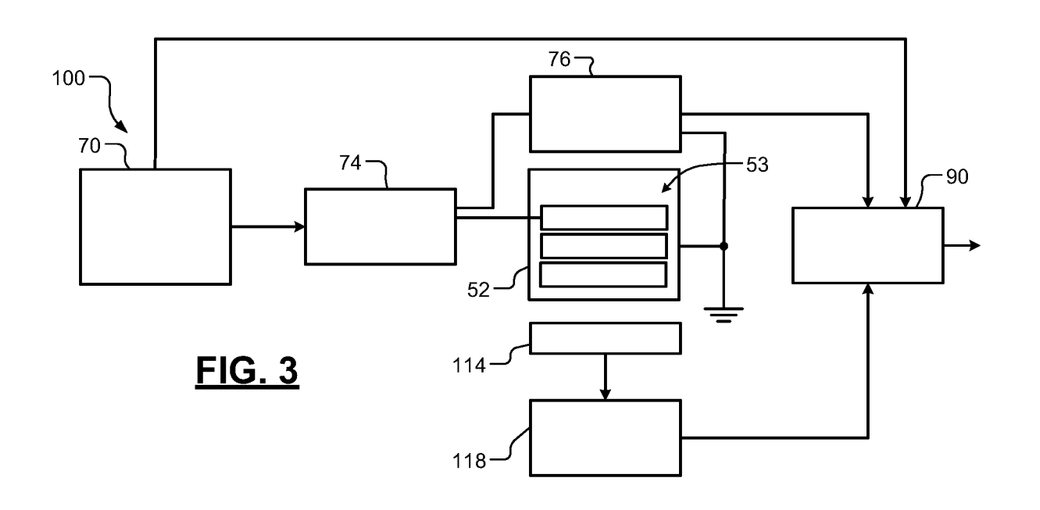
FIG. 3 is a functional block diagram of an example of a dielectric strength and partial discharge tester using an antenna according to the present disclosure.

Referring now to FIG. 3, another configuration of a testing system 100 for performing dielectric strength and PD testing is shown. The testing system 100 includes an antenna 114 that is arranged near the stator 52 to wirelessly sense the output signal and the PD signal. In some examples, the antenna 114 is an ultra-high frequency (UHF) antenna. As noted above, PD generates high-frequency noise on the output signal of the AC signal generator 70. When the winding of the stator 52 is energized, the antenna 114 senses both the output signal and high frequency noise corresponding to PD. The filter 82 filters the signal sensed by the antenna 114 to remove the lower frequency components including the output signal and to isolate the high frequency components including PD (if present). The high frequency components are output to the controller 90 for analysis.

Figure 4:
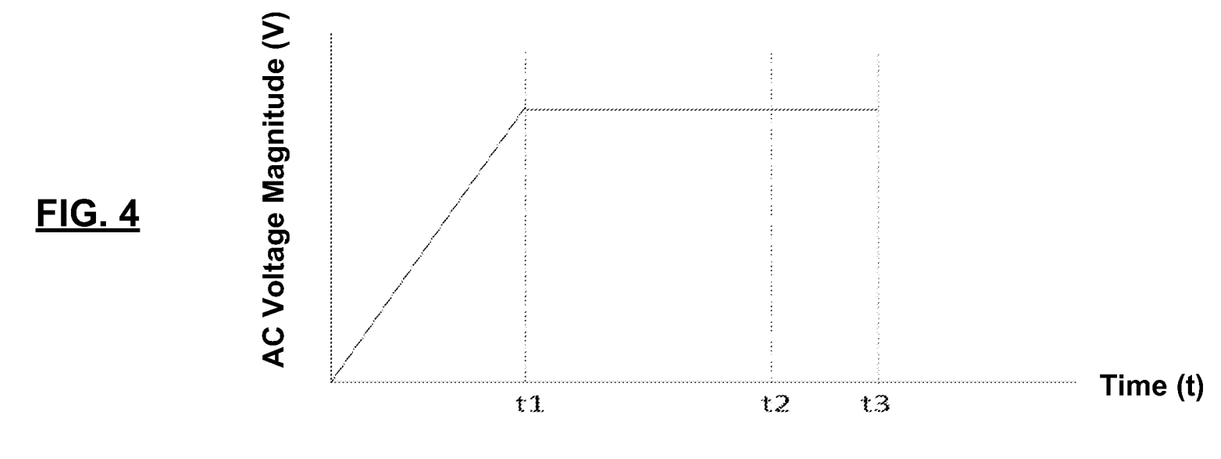
FIG. 4 is a graph illustrating an AC voltage magnitude as a function of time during the dielectric strength and partial discharge test according to the present disclosure.

In FIGS. 1 and 4, the switching system 74 generates the output signal during successive periods during which the dielectric strength and PD tests are sequentially performed, respectively. The switching system 74 connects the sinusoidal signal from the AC signal generator 70 to the winding and the current sensor 76 during a first predetermined period from time t1 to t2 (and the switching system 74 does not output to the filter 82). Then, the switching system 74 connects the sinusoidal signal from the AC signal generator 70 to the winding and the filter 82 during a second predetermined period from time t2 to t3 during which PD testing is performed.

In some examples, the first predetermined time period from t1 to t2 is longer than that the second predetermined period from t2 to t3. In some examples, the first predetermined time period is in a range from 10 to 50 cycles. In some examples, the second predetermined period is in a range from 10 to 15 cycles, which is generally sufficient for the evaluation of PD in the stator 52.

For example, the AC signal generator 70 generates the sinusoidal output signal during the dielectric strength and PD test. The switching system 74 is programmed to output X cycles (during the first time period from t1 to t2) per voltage step or at a specified voltage to the current sensor 76 and the controller 90 performs the dielectric strength test, where X is an integer greater than 2. Then, the switching system 74 outputs Y cycles (during the second time period from t2 to t3) to the filter 82 (and not the current sensor 76) and the controller 90 performs the PD test where X is an integer greater than 2. In some examples, the AC signal generator 70 outputs a synchronization or enable signal to the controller 90 when a test signal is generated.

In some examples, the dielectric strength test determines whether leakage current is greater than a predetermined threshold. For example, the controller 90 determines whether leakage current measured by the current sensor 76 during the dielectric strength test exceeds a predetermined current value (e.g., 5 mA) during the first predetermined period between t1 and t2.

During the PD portion of the test, the controller 90 determines whether a voltage of the filtered signal exceeds a predetermined threshold value (e.g., 0.2 V) when the magnitude of the sinusoidal output voltage is above a predetermined voltage value (e.g., 2000 V).

Figure 5:
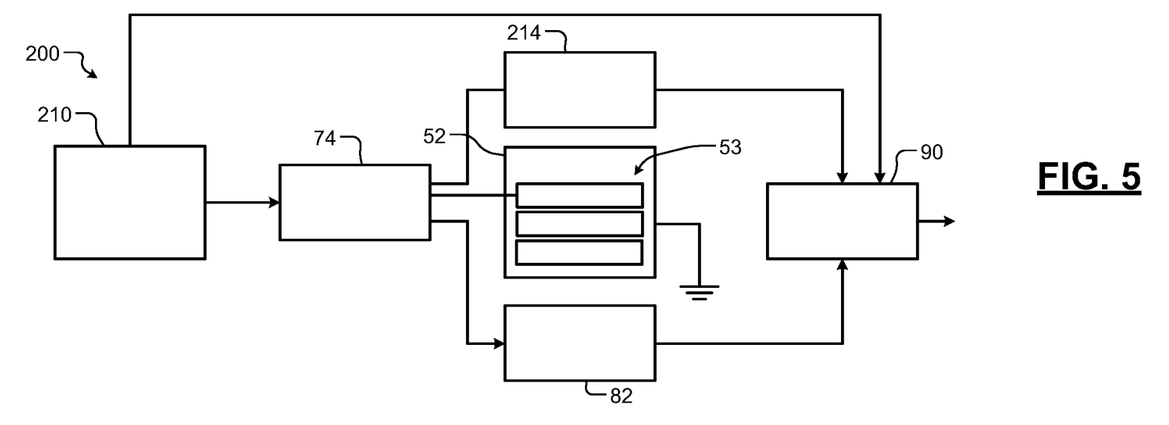
FIG. 5 is a functional block diagram of an example of a surge and partial discharge tester according to the present disclosure.
Figure 6:
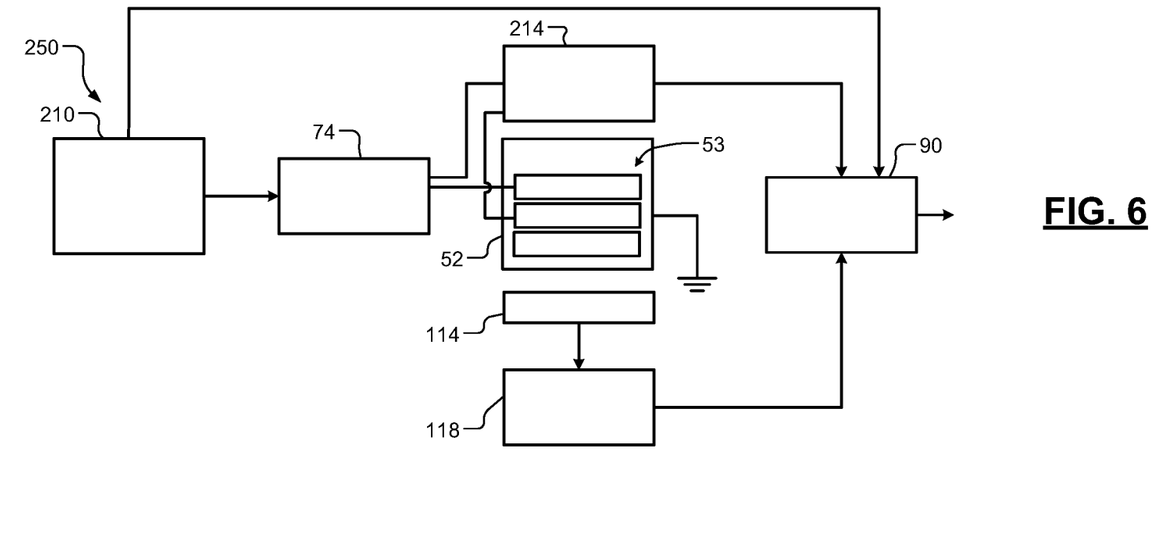
FIG. 6 is a functional block diagram of an example of a surge and partial discharge tester using an antenna according to the present disclosure.
Figure 7:
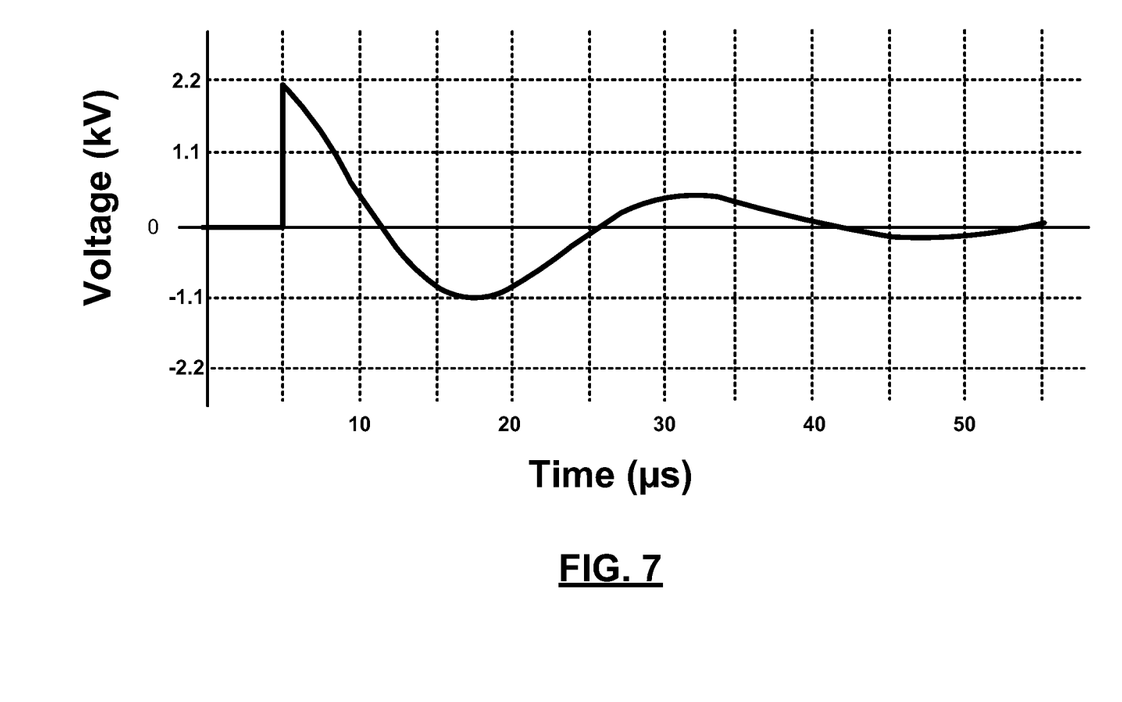
FIG. 7 is a graph illustrating a voltage response to an impulse signal as a function of time.

Referring now to FIGS. 5 to 7, testing systems 200 and 250 perform surge and PD testing in a similar manner using an impulse signal. The AC signal generator 70 and the current sensor 76 in FIGS. 1 and 3 are replaced by an impulse generator 210 and an analog to digital (A/D) converter and attenuator 214 and attenuator 214, respectively. In FIG. 5, the switching system 74 connects the impulse generator 210 to one or more of the windings 53 and to the A/D converter and attenuator 214 during the surge portion of the test and to one or more of the windings 53 and the filter 82 during the PD portion of the test.

In FIG. 6, the switching system 74 connects the impulse generator 210 to one or more of the windings 53 and to the A/D converter and attenuator 214 during the surge portion of the test and to the winding during the PD portion of the test. When the winding of the stator 52 is energized during the PD portion of the test, the antenna 114 senses both the output signal and high frequency noise corresponding to PD. The filter 82 filters the signal sensed by the antenna 114 to remove the lower frequency components including the output signal and to isolate the high frequency components including PD (if present). The high frequency components are output to the controller 90 for analysis.

In some examples, the impulse generator 210 outputs a high frequency pulse voltage (e.g., a square wave with sharp voltage rise). In some examples, the pulse voltage is in a range from 300 V to 5000V. In some examples, the pulse voltage is in a range from 300 V to 2500V. As can be appreciated, the impulse test can be run one or more times on each winding.

In FIG. 7, an example of the response of the stator windings to the impulse signal is shown as a function of time for a surge test between two terminals of a three-phase motor winding is shown. The voltage rises from zero to about 2100V and then the voltage "rings out" about 2 cycles before dropping back to zero. In some examples, the ringing process takes less than 50 microseconds. Faster rise times correspond to higher turn-turn voltage, which is the goal of surge testing. For example, the rise time in FIG. 7 is about 150 nano seconds (150 ns).

During the surge test, the high frequency impulse voltage causes ringing in the windings of the stator. The ringing dissipates due to resistance and other losses in the circuit (e.g., winding and/or insulation capacitance), which absorb the energy. The phase voltage of the windings is measured as a function of time. Generally, the measured phase voltage of the windings during surge testing is a sinusoidal waveform with damped oscillation. The PD corresponds to noise measured on top of the oscillating waveform. The PD is evaluated while using high frequency pulse voltage (similar to or the same as the surge test portion).

One terminal of the switching system 74 is connected to a first winding of the stator 52 (e.g., a selected stator phase lead). When the high frequency pulse voltage is output by the first terminal to the stator 52, a winding within the stator 52 is energized. The impulse generator 210 may send one or more voltage pulses as specified by the user through the controller 90.

Referring back to FIG. 5, the impulse signal causes resonance oscillation corresponding to an attenuated sine wave due to the inductance in the stator 52. The energy in the oscillation occurs between a capacitor in the impulse generator 210 and the winding of the stator 52. The surge test is performed. Then, the switching system 74 connects the AC signal generator 70 to the winding 53 and the filter 82. If partial discharge occurs for one or multiple voltage pulses, then a resultant signal is reflected onto the attenuated sine wave signal and is sensed by the filter 82. In other words, the controller 90 senses and stores a PD response and a corresponding PD voltage level. The reflected signal corresponds to high-frequency noise on top of the original attenuated sinusoidal signal through signal. The filter 82 removes the input signal and outputs a filtered signal (corresponding to high frequency components) to the controller 90.

The attenuated sine wave from A/D converter and attenuator 214 is compared by the controller to a reference stator response (from a reference winding). In addition, the controller 90 compares the responses between phases (3 phase comparison), and/or performs a comparison of the response at different sequential voltages. The comparison evaluates the difference among responses to define if it is significant or not.

If the antenna 114 is used (FIG. 6), the antenna 114 is located near the stator 52. Partial discharge events add high-frequency noise on top of the attenuated sinusoidal signal that is detected by the antenna 114. An output of the antenna 110 is filtered by the filter 118. The filter 118 is a high pass filter.

Figure 8:
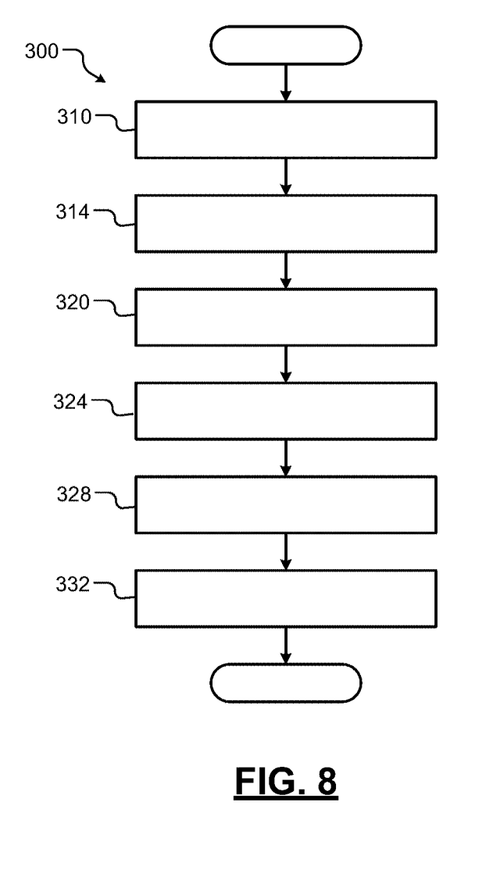
FIGS. 8 and 9 are flowcharts of examples of methods for performing partial discharge testing according to the present disclosure.

Referring now to FIG. 8, a method 300 for performing a surge test using an antenna is shown. At 310, the phase leads are connected. At 314, an antenna is arranged adjacent to the stator. At 320, P pulses are transmitted at a predetermined voltage V, where P is an integer greater than one (e.g., P=10). For example only, the predetermined voltage is set to 1600V. At 324, the filtered signal is evaluated for each phase. At 328, the controller analyzes the signals. At 332, the controller determines whether partial discharge inception voltage (PDIV) or repeated PDIV (RPDIV) occurred. For example, RPDIV may be declared when PD occurs for N of M test signals at a given voltage level.

Figure 9:
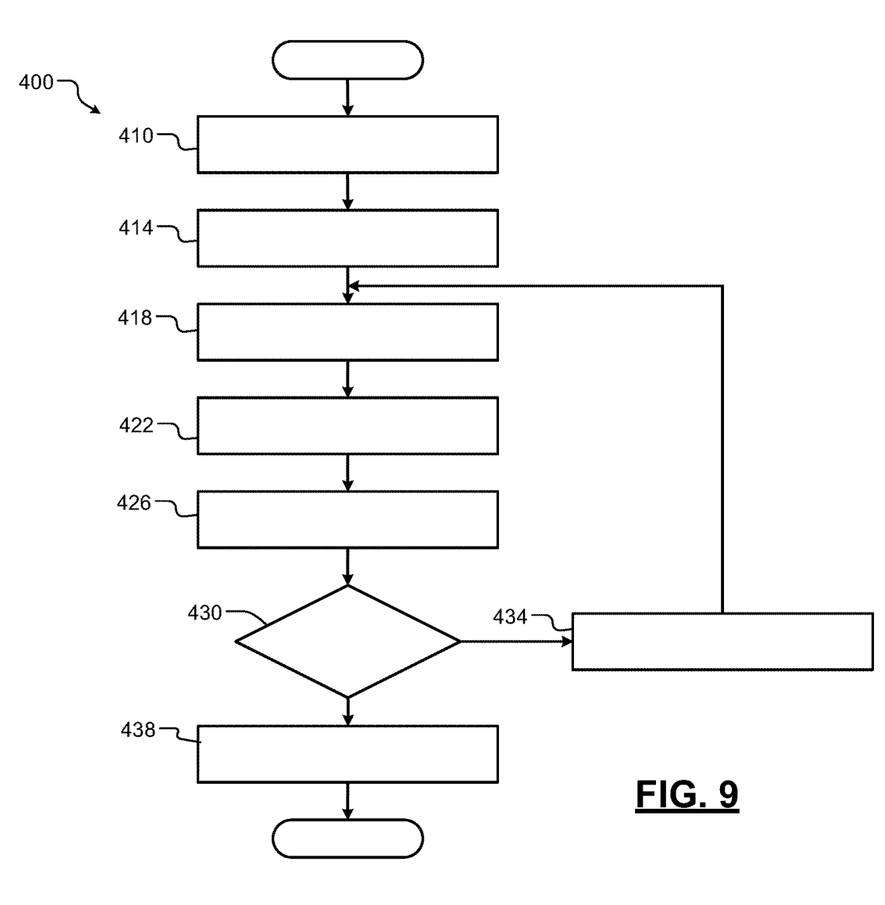

Referring now to FIG. 9, a method 400 for performing a surge test using an antenna is shown. At 410, the phase leads are connected. At 414, an antenna is arranged adjacent to the stator. At 418, T pulses are transmitted at a predetermined voltage V, where T is an integer greater than one (e.g., T=6). For example only, the predetermined voltage is set to 1600V. At 422, the filtered signal is evaluated for each phase. At 426, the controller analyzes the signals. At 430, the controller determines whether partial discharge inception voltage (PDIV) or repeated PDIV (RPDIV) occurred. If 430 is false, the method increases the predetermined voltage (within a predetermined range) at 434 and the method returns to 418. If 430 is true, the antenna is moved and the test is ended at 438.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A testing system, comprising:
   an AC signal generator configured to selectively generate a sinusoidal signal including a plurality of cycles;
   a dielectric strength and partial discharge tester for sequentially performing dielectric strength and partial discharge testing of a stator of an electric machine using the sinusoidal signal;
   a filter;
   a switching system configured to connect the AC signal generator to the stator of the electric machine and the filter during partial discharge testing; and
   a controller configured to receive an output of the filter during the partial discharge testing and to evaluate partial discharge of the electric machine.

2. The testing system of claim 1, wherein the dielectric strength and partial discharge tester includes a current sensor, wherein:
   the switching system is configured to connect the AC signal generator to the stator of the electric machine and to the current sensor during a dielectric strength test; and
   the controller is configured to receive an output of the current sensor during the dielectric strength test and to evaluate dielectric strength of the electric machine based thereon.

3. The testing system of claim 2, wherein, during dielectric strength testing, the switching system is configured to connect the AC signal generator to the stator of the electric machine and to the current sensor during X of the plurality of cycles, where X is an integer greater than one.

4. The testing system of claim 3, wherein, during partial discharge testing, the switching system is configured to connect to the filter and the stator of the electric machine during Y of the plurality of cycles, where Y is an integer greater than one.

5. The testing system of claim 4, wherein:
   X is in a range from 10 to 50, and
   Y is in a range from 10 to 15.

6. The testing system of claim 2, wherein the filter comprises a high pass filter.

7. The testing system of claim 6, wherein the controller identifies a partial discharge event when a filtered voltage output by the high pass filter has a voltage greater than a predetermined voltage threshold.

8. The testing system of claim 1, wherein a voltage of the sinusoidal signal has a magnitude in a range from 300 V to 5000V.

9. A testing system, comprising:
   an AC signal generator configured to selectively generate a sinusoidal signal including a plurality of cycles;
   a dielectric strength and partial discharge tester for sequentially performing dielectric strength and partial discharge testing of a stator of an electric machine using the sinusoidal signal;
   a filter;
   an antenna having an output connected to the filter;
   a switching system configured to connect the AC signal generator to the stator of the electric machine during partial discharge testing; and
   a controller configured to receive an output of the filter during the partial discharge testing and to evaluate partial discharge of the electric machine.

10. The testing system of claim 9, wherein the dielectric strength and partial discharge tester includes a current sensor, wherein:
    the switching system is configured to connect the AC signal generator to the stator of the electric machine and to the current sensor during a dielectric strength test; and
    the controller is configured to receive an output of the current sensor during the dielectric strength test and to evaluate dielectric strength of the electric machine based thereon.

11. A testing system, comprising:
    an impulse signal generator configured to selectively generate an impulse signal including a plurality of cycles;
    a surge and partial discharge tester for sequentially performing surge and partial discharge testing of a stator of an electric machine using the impulse signal;
    a filter comprising
       a plurality of capacitors connected in series between an input of the filter and an output of the filter,
       a plurality of Zener diodes connected between the output of the filter and a ground reference terminal,
       a first resistor connected between i) the plurality of capacitors and ii) the ground reference terminal, and
       a second resistor connected between i) one of the plurality of capacitors and one of the plurality of Zener diodes and ii) the output of the filter;
    a switching system configured to connect the impulse signal generator to the stator of the electric machine and the filter during partial discharge testing; and
    a controller configured to receive an output of the filter during the partial discharge testing and to evaluate partial discharge of the electric machine.

12. The testing system of claim 11, wherein the surge and partial discharge tester includes an analog to digital (A/D) converter and attenuator, wherein:
the switching system is configured to connect the impulse signal generator to a stator of the electric machine and to the A/D converter and attenuator during a surge test; and
the controller is configured to receive an output of the A/D converter and attenuator during the surge test.

13. The testing system of claim 12, further comprising:
an antenna having an output connected to the filter,
wherein the switching system is configured to connect the impulse signal generator to the stator of the electric machine during partial discharge testing, and
the controller is further configured to receive an output of the filter during the partial discharge testing and to evaluate partial discharge of the electric machine.

14. The testing system of claim 12, wherein, during surge testing, the switching system is configured to connect the impulse signal generator to the stator of the electric machine and to the A/D converter and attenuator.

15. The testing system of claim 12, wherein the filter comprises a high pass filter.

16. The testing system of claim 15, wherein the controller identifies a partial discharge event when a filtered voltage output by the high pass filter has a voltage greater than a predetermined voltage threshold.

17. The testing system of claim 11, wherein a voltage of the impulse signal has a magnitude in a range from 300 V to 5000V.

18. The testing system of claim 11, wherein the filter comprises a fuse connected between i) the one of the plurality of capacitors and the second resistor and ii) the output of the filter.

* * * * *